(12) United States Patent
Xia (10) Patent No.: US 7,896,950 B2
(45) Date of Patent: Mar. 1, 2011

(54) PLASMA-AIDED METHOD AND APPARATUS FOR HYDROGEN STORAGE AND ADSORPTION OF GASES INTO POROUS POWDER

(76) Inventor: Yashen Xia, Needham, MA (US)

( * ) Notice: Subject to any disclaimer, the term of this patent is extended or adjusted under 35 U.S.C. 154(b) by 1061 days.

(21) Appl. No.: 11/525,197

(22) Filed: Sep. 21, 2006

(65) Prior Publication Data

US 2007/0196590 A1 Aug. 23, 2007

Related U.S. Application Data

(60) Provisional application No. 60/774,867, filed on Feb. 21, 2006.

(51) Int. Cl.
*B03C 3/00* (2006.01)
(52) U.S. Cl. .......... 95/57; 96/15; 96/16; 96/134; 96/55; 96/143; 315/111.21; 427/569; 95/63; 95/90; 95/148
(58) Field of Classification Search ............... 95/57, 63, 95/90, 148; 96/15, 16, 122, 134, 143, 108; 427/569; 315/111.21
See application file for complete search history.

(56) References Cited

U.S. PATENT DOCUMENTS

| | | | | |
|---|---|---|---|---|
| 3,306,780 | A * | 2/1967 | Dieberg | 429/525 |
| 3,704,121 | A | 11/1972 | Makino et al. | |
| 4,560,393 | A * | 12/1985 | Way | 95/68 |
| 4,753,717 | A * | 6/1988 | Yata et al. | 204/242 |
| 5,106,399 | A | 4/1992 | Fisher | |
| 5,543,356 | A * | 8/1996 | Murakami et al. | 438/548 |
| 6,171,451 | B1 * | 1/2001 | Miley et al. | 204/173 |
| 6,335,535 | B1 * | 1/2002 | Miyake et al. | 250/492.21 |
| 6,372,018 | B1 | 4/2002 | Cowles | |
| 6,713,400 | B1 | 3/2004 | Branz | |
| 2005/0258360 | A1 | 11/2005 | Whitehouse et al. | |
| 2005/0268779 | A1 * | 12/2005 | Fan et al. | 95/57 |
| 2006/0191409 | A1 * | 8/2006 | Fan et al. | 95/61 |

OTHER PUBLICATIONS

Chahine, R. and T. Bose, "Low-pressure Adsorption Storage of Hydrogen", Int. J. Hydrogen Energy, vol. 19, No. 2, pp. 161-164, 1994.
Chambers, A., et al., "Hydrogen Storage in Graphite Nanofibers", J. Physical Chemistry B, vol. 102, No. 22, May 28, 1998, pp. 4253-4256.
Dillon A., et. al., "Hydrogen Storage Using Carbon Adsorbents: Past, Present and Future", Applied Physics A, vol. 72, pp. 133-142, 2001.
Gupta B., et al., "Further Studies on Microstructural Characterization and Hydrogenation behaviour of Graphitic Nanofibers", Int. J. Hydrogen Energy, vol. 26, 2001, pp. 857-862.
Hydrogen and other alternative fuels for air and ground transportation, H. W. Pohl, Ed. (John Wiley & Sons, Chichester 1995). Chaps. 7-11.
Hynek, S., et al., "Hydrogen Storage by Carbon Sorption", Int. J. Hydrogen Energy, vol. 22, No. 6, pp. 601-610, 1997.

(Continued)

*Primary Examiner* — Robert J. Hill, Jr.
*Assistant Examiner* — Christopher P Jones (57) ABSTRACT

Provided are plasma-aided gas storage methods and apparatus. In one embodiment, a porous powder bed assembly equipped with corona discharge electrodes is used to generate a non-equilibrium plasma of negatively ionized gas molecules which absorb onto porous particles, e.g., activated charcoal, to form a gas storage entity. Gas adsorbed onto the particles is desorbed at moderate temperatures by aid of ultraviolet light illumination.

7 Claims, 4 Drawing Sheets

OTHER PUBLICATIONS

Imamura, H., et al., Journal of Alloys and Compounds, 253-254, (1997) pp. 34-37.

Poirier, E., et al., "Hydrogen Adsorption in Carbon Nanostructures", Int. J. Hydrogen Energy, vol. 26, pp. 831-835, 2001.

Spence, D., et al., Plasma Modified Production of High-current, High-purity cw $H^+$, $D^+$, and H-Beams from Microwave-driven Sources, Proc. Of LINAC '96. Paper MOP10 (1996).

Stoffels, E., et al, "Plasma chemistry and surface processes of negative ions", Plasma Sources and Science Technology, vol. 10 (2001) 311-317.

Wang, J.C., et al., "Hydrogen Storage in Fullerenes and in an Organic Hydride", Proceedings of the 1998 U.S. DOE Hydrogen Program Review, USA 1998.

Wang, Q. and J. Johnson, "Computer Simulations of Hydrogen Adsorption on Graphite Nanofibers", J. Physical Chemistry B, vol. 103, No. 2, Jan. 14, 1999, pp. 277-281.

Ye. Y., et al., "Hydrogen Adsorption and Phase Transition in Fullerite," Applied Physics Letters, vol. 77, No. 14, Oct. 2, 2000, pp. 2171-2173.

Zaluska, A. et al., "Structure, catalysis and atomic reactions on the nano-scale: a systematic approach to metal hydrides for hydrogen storage," Appl. Phys. A, 72, 157 (2001).

* cited by examiner

PLASMA-AIDED METHOD AND APPARATUS FOR HYDROGEN STORAGE AND ADSORPTION OF GASES INTO POROUS POWDER

CROSS-REFERENCE TO RELATED APPLICATIONS

This application claims the benefit of U.S. Provisional Application No. 60/774,867, filed Feb. 21, 2006, the contents of which are hereby incorporated by this reference in their entirety.

FIELD OF THE INVENTION

Provided are methods and apparatus for gas storage that allow a non-equilibrium plasma, for example, negative hydrogen ions and hydrogen atoms, to be reversibly stored in porous particles comprising positively charged and dangling-bond sites, for example, activated charcoal.

BACKGROUND OF THE INVENTION

Hydrogen is the simplest and most abundant element in the universe. Hydrogen-based energy is considered the cleanest of the currently known energy sources. Hydrogen fuel cells are expected to be applied widely to various industries in the future since they may harness the chemical energy of hydrogen to generate electricity without combustion or pollution. Hydrogen storage, however, has been a major bottleneck for long time. Currently, there are only four major systems for hydrogen storage [1, 2]: liquid hydrogen, compressed hydrogen gas, cryo-adsorption system, and metal hydride systems [3]. On the one hand, hydrogen's great asset as a renewable energy carrier is that it is storable and transportable. On the other hand, its very low natural density requires storage volumes that still are impractical for vehicles and many other uses. Current practice has been focused on compressing the gas in pressurized tanks, but this still provides only limited driving range for vehicles and is bulkier than desirable for other uses as well. It also has been found that liquefying the hydrogen more than doubles the fuel density, but uses up substantial amounts of energy to lower the temperature sufficiently (−253° C. at atmospheric pressure), requires expensive insulated tanks to maintain that temperature, and still falls short of desired driving range. One possible way has been tried to store hydrogen at higher density is in the spaces within the crystalline structure of metal hydrides. Heat then releases the hydrogen for use. Thus far, however, densities are still not high enough and costs are high.

It is well known that porous carbon powder is able to adsorb neutral hydrogen molecules in its microscopic pores. The main problems are that high pressures must be applied in order to get the neutral hydrogen molecules into the pores. About 5.2 wt % of hydrogen adsorbed into the activated carbon has been achieved at cryogenic temperatures and at pressures of about 45-60 bar [5, 6]. At ambient temperatures and at a pressure of 60 atm the adsorption figure has been only approximately 0.5 wt % [4-14], and unfortunately this method does not meet the target values of 6.5 wt % established by the U.S. Department of Energy (DOE) hydrogen storage for needs of automotive industry.

Electronegative gases and plasmas currently have attracted attention mainly in applications related to surface processing, atmospheric science, environmental studies for disposal gas cleaning and many others. Therefore there are many situations in contemporary plasma physics in which the role of negative ions is significant. The fundamental properties of negative ions have been extensively studied [15, 16 and 17]. Electronegative plasmas are also commonly used for the generation of negative ion beams [18]. The technique of ionization of hydrogen is based on utilization of the gas discharge plasma. Gas discharge plasma is an active and dynamic medium. The plasma can be understood as a partly ionized gas, where a certain part of the gas atoms or molecules are ionized to form ions under simultaneous production of electrons. Being charged, these items interact with each other. Interaction with electromagnetic fields leads to the exertion of forces acting on molecular or atomic particles. The plasma requires a continuous supply of power. The system transferring power into the gas for the ionization process constitutes the plasma source. Besides the charged particles, the plasma also comprises neutral particles having their inner electronic states changed (excited particles) or having an enhanced chemical reactivity (dissociated molecules, radicals). The plasma can be considered a dynamic system of the generation and decay of charged and activated species.

A corona is a process by which a current develops from an electrode with a high potential in a neutral fluid, e.g., hydrogen or oxygen, by ionizing the fluid so as to create plasma around the electrodes. The ions generated eventually pass the charge to nearby areas of lower potential or recombine to form neutral gas molecules. For hydrogen gas, when the potential gradient is large enough at a point in the hydrogen fluid, the fluid at that point ionizes and it becomes conductive. If a charged object has a sharp point, the hydrogen around that point will be at a much higher gradient than elsewhere. Hydrogen near the electrode can become ionized (partially conductive), while regions more distant do not. When the hydrogen near the point becomes conductive, it has the effect of increasing the apparent size of the conductor. Since the new conductive region is less sharp, the ionization may not extend past this local region. Outside of this region of ionization and conductivity, the charged hydrogen particles slowly find their way to oppositely charged objects and are neutralized. If the geometry and gradient are such that the ionized region continues growing instead of stopping at a certain radius, a completely conductive path may be formed, resulting in a momentary spark, or a continuous arc.

Coronas may be either positive or negative. This is determined by the polarity of the voltage on the highly-curved electrode. This asymmetry is a result of the great difference in mass between electrons and positively charged or dangling-bond site ions, with only the electron having the ability to undergo a significant degree of ionizing inelastic collision at a room temperature and ordinary hydrogen pressure (e.g., 1 atm).

SUMMARY OF THE INVENTION

Provided are non-thermal plasma-aided methods and apparatus, which allow the storage of a non-equilibrium plasma of a gas, for example a plasma comprising negative hydrogen ions, on activated porous particles by employing corona technology to produce plasma and negative ions of the gas above a multi-layer powder bed, e.g., an activated charcoal powder bed.

The methods and apparatus utilize electron-induced negative gas ions by corona discharge and obtain a reversible adsorption on activated porous powder, e.g., charcoal or other like material, preferably with active sites, e.g., dangling bonds or positively charged surfaces, while negative ions of the gas are produced by a non-thermal-discharge plasma or negative ion generation units.

Accordingly, provided in one aspect are methods and apparatus for the application of a corona discharge to hydrogen gas, which is dissociated before negative hydrogen ions form and attach to an activated powder, e.g., charcoal, which contains many positively charged and dangling-bond active sites. The resultant hydrogen-charged porous powder may be used as a medium for hydrogen storage and may be stored in any electrical insulation enclosure or in cartridges.

We have found that dehydrogenation of charged porous powder occurs at moderate temperatures (e.g., between 50° C. and 300° C., or for example, 75° C.), indicating that a hydrogenated surface complex with mixed structures bonded by both ionizing and covalence on porous powder, such as commercially available activated charcoal, may be dehydrogenated easily. Thus, by heating to a moderate temperature and with the aid of shortwave ultraviolet light (light of a wavelength of ~254 nm and/or 185 nm) illumination, hydrogen may be desorbed and recovered at moderate conditions from the powder. Since the hydrogen storage is reversible, this technology presents a novel solution to making hydrogen sources available to a variety of applications including those mentioned above.

Accordingly, provided in another aspect are methods for reversibly adsorbing a gas, wherein the porous powder is contacted with a negative gas ion-containing environment at an ambient temperature and various pressures, e.g., 1 atm (absolute). The solid-state porous powder may be exposed to a gas ion-containing atmosphere which is preferably free of contaminants, particularly oxygen molecules, at an ordinary temperatures and pressures.

Further objectives and advantages of the present invention will become apparent as the description proceeds. To gain a full appreciation of the scope of the present invention, it will be further recognized that various aspects of the present invention can be combined to make desirable embodiments of the invention.

DETAILED DESCRIPTION OF THE INVENTION

For convenience, before further description of the present invention, certain terms employed in the specification, examples and appended claims are collected here. These definitions should be read in light of the remainder of the disclosure and understood as by a person of ordinary skill in the art. Unless defined otherwise, all technical and scientific terms used herein have the same meaning as commonly understood by a person of ordinary skill in the art.

The articles "a" and "an" are used herein to refer to one or to more than one (i.e., to at least one) of the grammatical object of the article. By way of example, "an element" means one element or more than one element.

The term "active site" refers to a site that is reactive with an ion or atom.

The terms "comprise" and "comprising" are used in the inclusive, open sense, meaning that additional elements may be included.

The term "dangling bond" refers to a broken covalent bond.

The term "gas-charged porous particle" refers to a particle with pores having a gas adsorbed onto it by charge-charge interactions or covalent bonds.

The term "including" is used herein to mean "including but not limited to". "Including" and "including but not limited to" are used interchangeably.

The term "ion" refers to an atom, group of atoms, or subatomic particle that normally is electrically neutral and achieves its status as an ion by loss (or addition) of an electron.

The term "ionizable gas" refers to a gas whose atoms have the capability to be turned into ions.

A "non-equilibrium plasma" is a plasma wherein only electrons are at a high temperature (high electron energy) and both ions and neutral molecules are at an ordinary temperature (low ion/molecule energy).

A "plasma" is a gaslike state of matter consisting of positively or negatively charged ions, free electrons, and neutral particles.

The term "porous particle" refers to any body, spherical or otherwise, having at least one hole or "pore" capable of admitting a gas or liquid.

We have found that charcoal particles at a size of about 2 micrometers, which are employed in an environment of non-thermal plasma or corona discharge with negative ions of hydrogen, absorb hydrogen at least about 7.5 wt % at ordinary temperatures, exceeding the DOE target for automotive applications.

Accordingly, in one aspect, provided are methods and apparatus for creating an ionized gas/solid adsorption bed for plasma treatment of gas, e.g. hydrogen, and more particularly methods of storing ions of the gas so produced into a bed of porous particles utilizing the non-equilibrium plasma. An advantage of the present invention is that the non-equilibrium plasma of gas includes negative ions and atoms which could all interact with activated or normal atoms on the surface of the particles comprising the bed by either ionic or covalent interactions respectively, so that the plasma particles may be attracted into the pores of the powder, such as, for example, activated charcoal. For example, for hydrogen, due to ionic action and covalent force, negative hydrogen ions and hydrogen atoms may attach, respectively, to those active sites of the porous particles and be held on the surface, thus allowing hydrogen storage on the porous particles.

There are at least two kinds of active sites on a particle surface: (1) ionic defects or positively-charged sites, e.g., one positively-charged carbon on surface for activated charcoal, and (2) sites with a broken covalent bond or a dangling bond, e.g., a bond-broken carbon atom in charcoal surface, which is missing a neighbor on the surface to which it would be able to bind. The pores of the particles comprising the bed may have many such active sites, i.e., positively charged and dangling-bond sites, that may combine with negative hydrogen ions by ionic action and with hydrogen atoms by covalent bonding, respectively, so that those sites may hold hydrogen on the pores of the activated particles via a hydride complex.

The adsorption bed includes high bias voltage electricity which is used to create a non-equilibrium plasma including hydrogen ions absorbed in a bed of activated porous particles with particles having such positively charged and dangling-bonds, e.g., charcoal particles. For example, a porous powder bed assembly equipped with corona discharge units comprising electrodes may be employed to create non-equilibrium plasma or negatively ionized hydrogen molecules which absorb into the pores of the particles comprising the bed of powder, e.g., activated charcoal with active sites or surface defects including both positively charged and dangling-bond sites, as well as large specific surface areas to form hydrogen storage space.

In a plasma-aided absorbance bed, the corona discharge units may contain an array of electrodes that are energized by the bias negative electricity to form a negative corona which interacts with the feeding hydrogen gas and subsequently forms a non-equilibrium plasma mainly composed of negative hydrogen ions before they are attracted into the active centers in pores of particles that form a surface hydride complex. For corona-aided adsorption on porous particles, e.g., activated charcoal, the plasma is at least composed of both negative ions of hydrogen and hydrogen atoms. Thus, the following reactions could occur, for hydrogen gas:

$$H_2 + e- \rightarrow H_2(\text{vibrationally excited}) + e- \quad (1)$$

$$H_2(\text{vibrationally excited}) + e- \rightarrow H- + H \quad (2)$$

$$H + e- \rightarrow H- + \text{photon} \quad (3)$$

and for an ionic carbon surface with one positive charge <C+>, $$H- + <C+>(\text{ionized site}) \rightarrow [C:H](\text{ionic bonding}) \quad (4)$$

and for a surface with a dangling bond <C->:

$$H- + <C->(\text{dangling bond}) \rightarrow (C-H)(\text{covalence bonding}) + e- \quad (5)$$

$$H + <C->(\text{dangling bond}) \rightarrow (C-H)(\text{covalence bonding}) \quad (6)$$

For example, to obtain a reversible desorption for a hydrogenated charcoal or graphite surface by means of UV light illumination, dehydrogenation could be carried out for a hydride complex through ionic and covalent association respectively, as follows:

$$[C:H](\text{ionic bonding}) + e- \rightarrow C+(\text{ionized site}) + H- \quad (7)$$

$$H- + \text{photon} \rightarrow H + e- \quad (8)$$

$$H- + e= \rightarrow H + 2e- \quad (9)$$

$$[C-H](\text{covalent bonding}) + e- \rightarrow C-(\text{dangling bond}) + H \quad (10)$$

$$H + H \rightarrow H_2 \quad (11)$$

Producing a non-equilibrium plasma begins with producing a bias electric field on particle pores above a bed of particles within a chamber whereby the bias electric field with high negative voltage creates a corona discharge among the hydrogen gas molecules. Corona discharge creates an intense ionic environment which can produce electrons, negative hydrogen molecular ions, and hydrogen atoms. Corona discharge on hydrogen molecules produces ionized gas and excited atoms which then feeds into interior pores with the positively charged and dangling-bond sites. The non-equilibrium plasma components may approach the complex pores as the feeding hydrogen gas passes through the activated particle bed. The bias electric field can be increased in strength to a level sufficient to produce concentrated non-equilibrium plasma including negative hydrogen ions which tend to attach activated or positively charged and dangling-bond sites of porous particles.

We have found that non-equilibrium plasma or negative ions of hydrogen having sufficient energy to efficiently and effectively be absorbed into porous particles may be generated easily using electricity with a bias negative voltage (e.g., from −1 to −22 kV on an array of ionizer units operated by high electrical voltage generators in various power strengths (e.g., from 1 Watt to 50 kilo-Watts). The electrodes (pins) may be arranged along the wall of an electronic insulation chamber with pins pointing to the center of the chamber, and/or just above the particle bed. It is preferred to arrange the electrodes evenly to obtain a uniform electrical field and to avoid having electrodes contacting the wall or particle bed.

The plasma-aided absorbance bed may be, for example, a fixed bed for batch operation or a moving bed for continuous operation.

Negative ions of hydrogen also may be produced by other non-thermal plasma technologies [19], including high frequency methods, e.g., radio frequency plasma (RF), microwave plasma, inductively coupled plasma (ICP); and high voltage methods, e.g., dielectric barrier discharge (DBD), and electron beam (EB).

Figure 1:
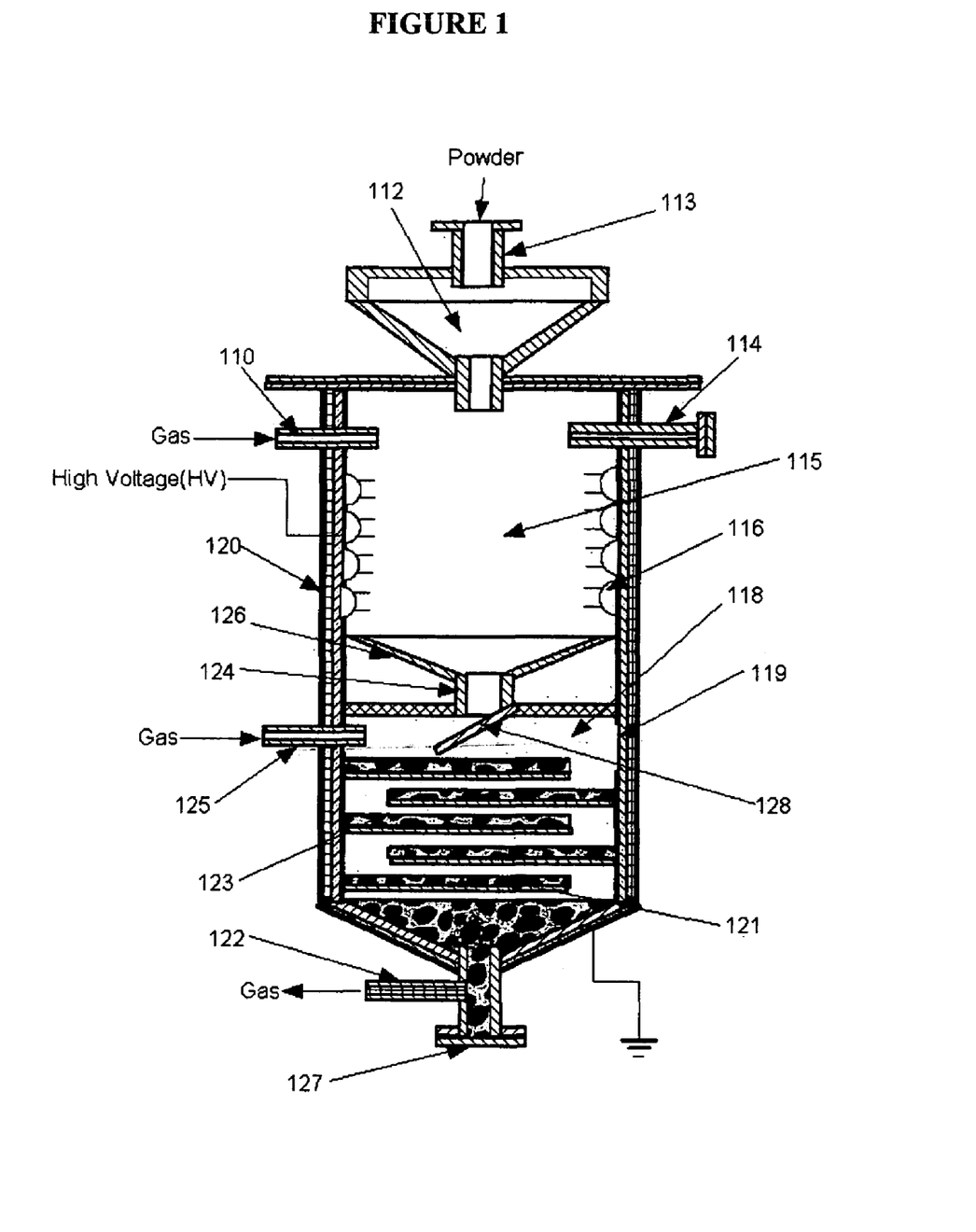
FIG. 1 is a diagrammatical illustration of one implementation of a hydrogen absorption bed in accordance with the present invention.

An exemplary apparatus for implementing a method for ionizing hydrogen gas in activated particles is shown in FIG. 1. A hydrogen gas feed may be ionized into negative hydrogen ions and excited atoms, then the negatively ionized hydrogen gas and atoms are adsorbed into the active sites of either positively charged or dangling-bond sites.

More specifically, FIG. 1 depicts an exemplary plasma-aided powder bed assembly. The upper chamber 115 allows mass, and energy transfer between downstream plasma particles. The lower chamber 118 is a multi-layer fixed bed of particles and upper chamber 115 are substantially operated in batch or continuous mode when a gas filter 122 is utilized. Through the port 113 and particle feeders 112, powder may be fed into the upper and then the lower chambers. The particle bed 120 has an interior electron insulation housing 119 which prevents operators from large electrical shock. The internal shell or housing 119 is preferably formed of any suitable insulating material for the purpose of avoiding electrical shock, such. The particle layers 123 stay in the support plate 121 for a certain time for adsorption and is pushed down by downstream gas flow from primary hydrogen gas stream through the port 110 and from the secondary purge of gas of hydrogen through the port 125, the funnel 126, magnetic ring 124 and routing plate 128, to the lower layer before moving out the chamber. For effective and fast adsorption, each particle layer is preferably kept thin for fast adsorption, e.g., about 1 cm to about 3 cm, dependent on plasma power strength and the concentrations of ions and atoms above the powder bed. The bed preferably has a large exposed area to downstream ions for better adsorption. The bed and system is vacuumed though the port 114 before starting operation. The hydrogen-charged particles may be disposed through the port 127 periodically or continuously. The outer shell may be constructed of any metallic material (e.g., stainless steel) with earth ground.

The bed 120 includes a bias electric field generator 116, particle feeder 112, and particle outlet port 121. The bed 120 may be of either the fixed bed or moving bed type to achieve either batch or continuous operation. A hydrogen gas supply is connected to the absorption bed 120. Hydrogen gas is passed from the port 110 into the electrical corona chamber 115 at a feeding pressure, e.g., 1 atm (absolute). The electric field generator 116 creates a bias electric field. The electric field should have a proper plasma strength or sufficient power for the powder volume used so as to create a powerful corona discharge and a subsequent high concentration of negative hydrogen ions in the chamber 115 to allow for adsorption of ions of gas into the activated porous powder, e.g., activated charcoal.

The corona discharge produces non-equilibrium plasma including negative hydrogen ions from the hydrogen fluid. The non-equilibrium plasma including negative hydrogen ions flows from the upper chamber 115 into the bed 118 of activated porous powder. Once inside the particles, the non-equilibrium plasma including negative hydrogen ions enters the pores of the activated particles 118.

A high electrical voltage is applied across the array of electrodes 116 to create an electric field through lower chamber 115. Preferably, electrode 116 is connected to a high negative voltage supply (not shown) at least about 1 kV. The bias electric field must have sufficient strength to highly ionize the hydrogen molecules in chamber 115.

In order to extract the negative ions of hydrogen into the bed without destruction by fast electrons in the chamber and to minimize amount of hydrogen atoms entering the internal pores and active centers of the particles, the rings of permanent magnets 124, e.g., neodymium-iron-boron (NIB) or other material capable of producing magnetic field, are put in the middle of the chamber, which is divided into two regions, the plasma region and the powder region, respectively, to extract negative ions into the powder bed through an aperture, and to modify electron energy distribution.

It is preferable to employ porous particles having a large specific surface area, where there are more active sites for negative ion attachment. More active sites, preferably positively charged sites on surface, larger specific surface area of porous particles, and stronger electrical and magnetic field strengths lead to larger and faster absorption of negative hydrogen ions in the porous powder and easier desorption in moderate conditions. The preferred size of the particles is small, e.g, from 1 micrometers to 50 micrometers, with a large surface area, e.g., 1000 $m^2/g$ or more; and many active sites with positive charges for negative ions attachment and dangling bond sites for covalent binding. However, larger or smaller particles may be used provided that sufficient surface area and active sites are present and available for reaction.

Preferably, the bias electric field has a sufficient strength to create a volumetric corona discharge and subsequent negative ions of hydrogen above the chamber 115 and throughout the lower particle bed 118.

The ionizing environment produced as described herein may be used for storage of many other neutral or common gaseous molecules or gas wastes into porous particles. Ionization of other gas ions, e.g., negative ions of oxygen, may be stored into pores of positively charged or dangling-bond sites.

Figure 2:
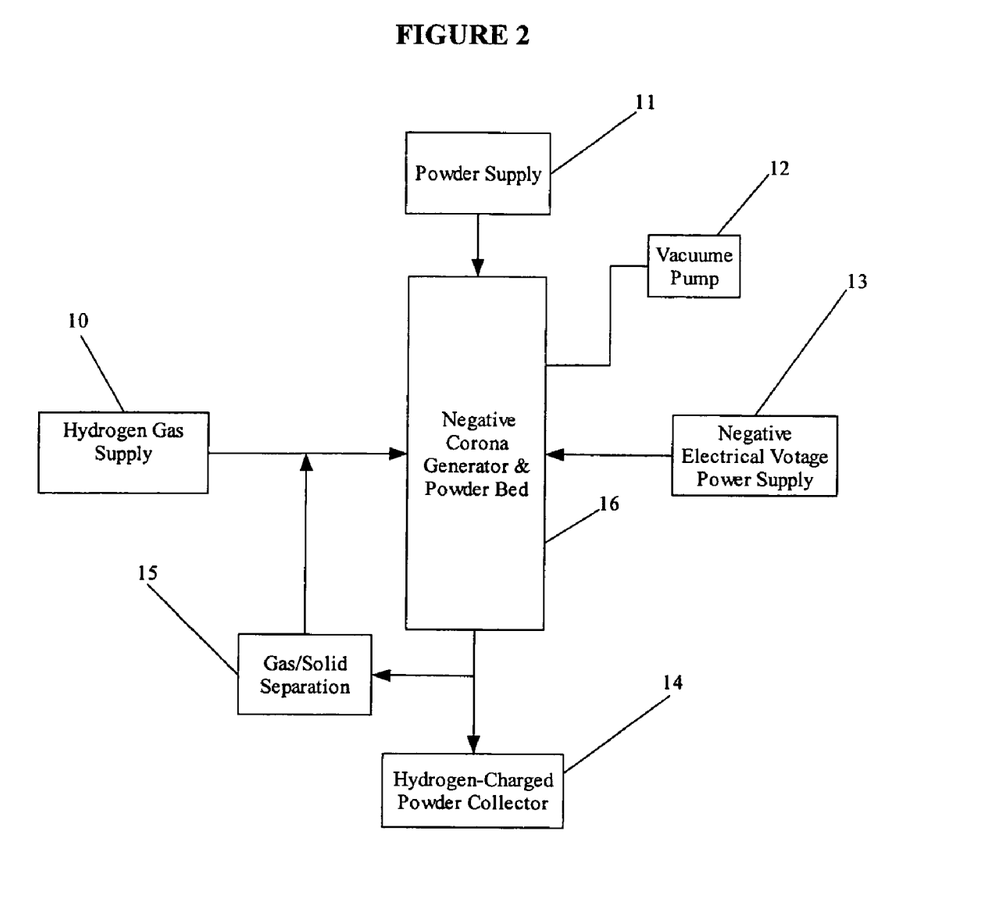
FIG. 2 is a diagrammatical representation of an example of the continuous operation of a hydrogen storage system in accordance with the present invention.

In order to operate in continuous mode, as shown in FIG. 2, a non-thermal plasma or corona particle bed 16 may be connected to a hydrogen supply 10 (e.g., or pure hydrogen gas from hydrogen generator by water electrolysis and gas tank). The particle bed may be connected to any hydrogen source, e.g. a natural gas reformer system to obtain pure hydrogen gas. An embodiment comprising a hydrogen generator using water electrolysis may be advantageous in that the hydrogen gas could be made and then stored in the porous particles in locations wherever water is available. The powder supply 11 has capacity to supply a volume of powder for continuous operation. The negative electrical voltage generator 13 provides negative electricity, e.g., −1 kV, to electrodes or pins above the particle bed. After the particles are allowed to adsorb hydrogen for a certain time period, e.g. varied from 5 minutes to 600 minutes, dependent on the electrical power strength and natures of the bed, the particles are transferred downward to a container 14. The rest of hydrogen passed through the powder bed is separated by at least one gas/solid separator, e.g., gas filters, to be sent back to the inlet of the powder bed. Before operation, the entire bed and system may be vacuumed through a vacuum pump 12 to avoid oxygen and moisture from air, preferably after regeneration of the porous powder, e.g. charcoal, by heating in a vacuum, e.g., in 300° C.

Figure 3:
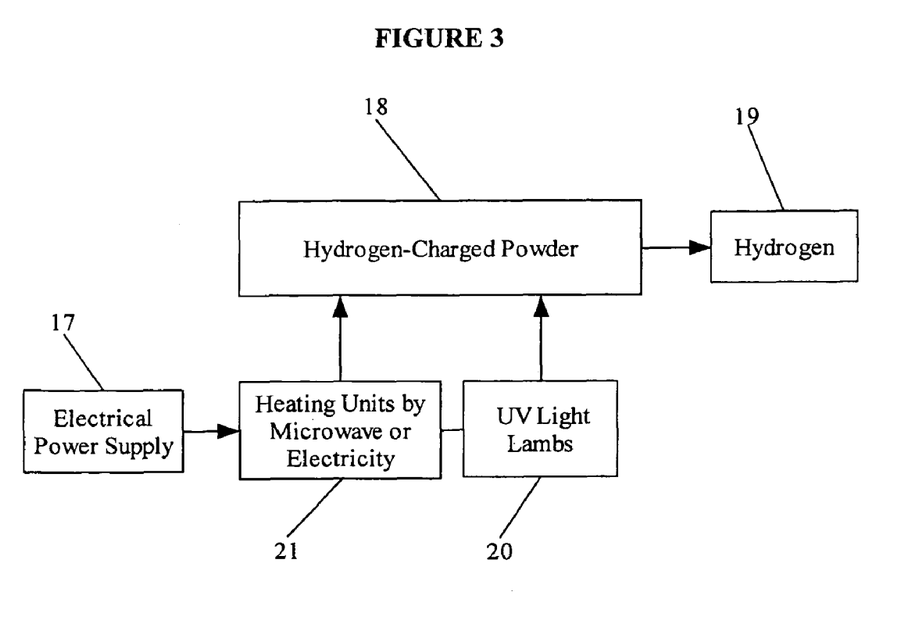
FIG. 3 is a diagrammatical illustration of one implementation of hydrogen desorption in accordance with the present invention.

FIG. 3 shows a method for desorbing the hydrogen from hydrogen-charged particles 18. UV illumination is employed to induce non-thermal stimulation to assist recovering the hydrogen. Hydrogen ions attached on the active carbon sites of particles are excited and expelled from defective carbon surface, while solid carbon is expected to remain on the surface after dehydrogenation or recovery of hydrogen. During dehydrogenation, heating by electricity (or microwave which is more effective) energizes the particle surface to induce expelling the attached hydrogen ions and atoms at a temperature, e.g., 75° C., while shortwave ultraviolet (e.g., from 185 nm to 254 nm, generated by 254 nm and/or 185 nm UV lamps which are commercially available) light illumination delivers photons to desorbed components to obtain mixtures of hydrogen molecules, atoms and/or ions to be used for various applications, e.g., fuel cell.

Most of the adsorbed hydrogen can be desorbed from the particles using ultraviolet light illumination at various temperatures including ambient or room temperature.

Figure 4:
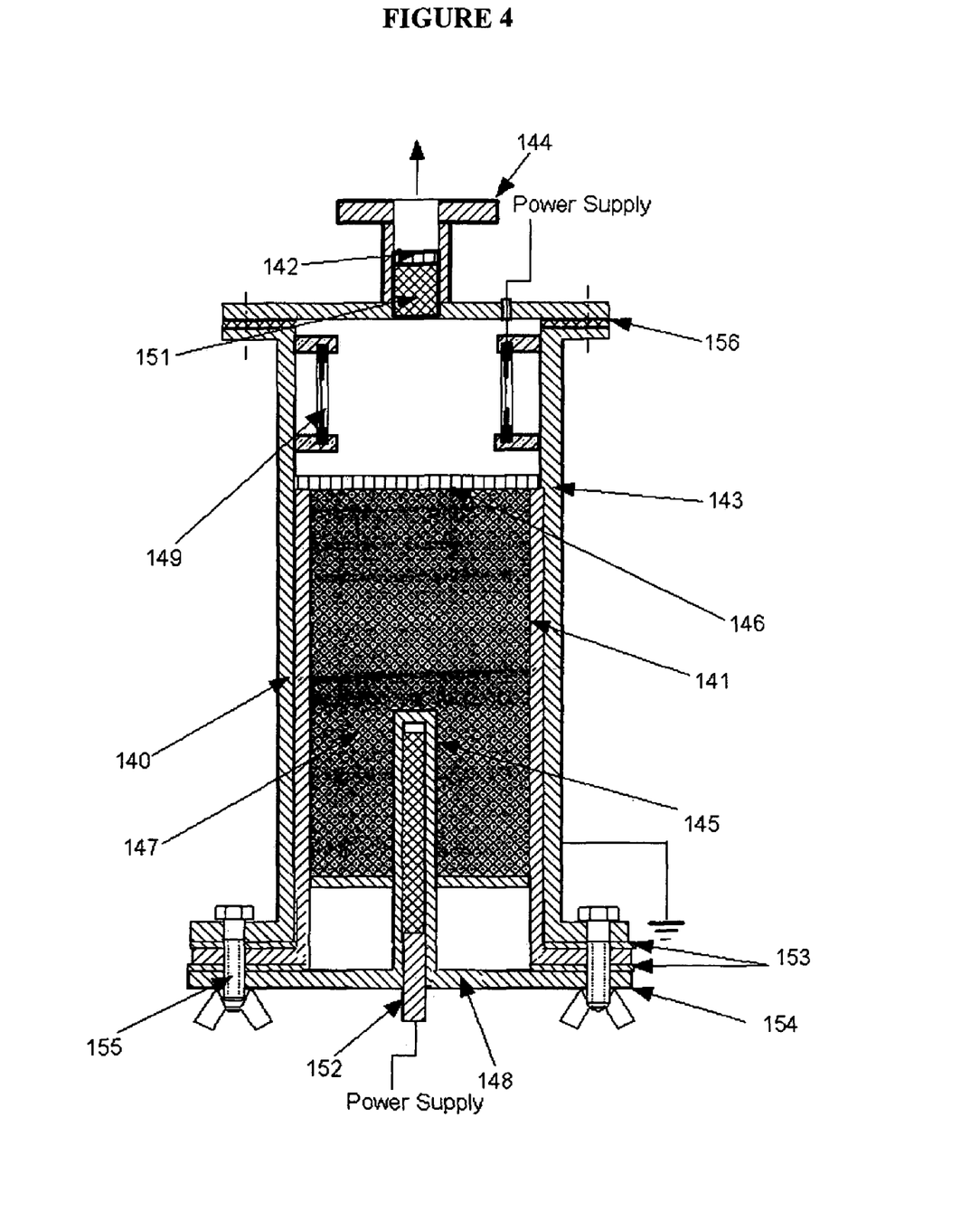
FIG. 4 is a diagrammatical representation of an example of a hydrogen-charged powder cartridge in accordance with the present invention.

FIG. 4 depicts an exemplary hydrogen-charged powder cartridge. The cartridge may be constructed in at least three parts, i.e., a particle holder 141, a UV illumination chamber 143 and a flange cover with heating unit 148. The parts may be fastened together easily by screws 155. In order to keep vacuum tight among all parts, rubber gaskets 153 and 156 may be used. The cartridge may be made of any material suitable to contain the reaction, e.g. metals (e.g., stainless steel or aluminum) or non-metal materials (e.g., ceramics, glass). The particle holder 141 may be removed from the UV illumination chamber 143 and disassembled to refill the hydrogen-charged powder. The UV illumination chamber 143 may include at least one glass wool filter 151, at least one UV light lamp 149, and at least one filter 142.

The UV lamp 149 is employed to provide non-thermal stimulation on desorbed component to recover hydrogen and dissociate impurities. The filter 151 may comprise an inert filtering material, e.g., glass wool or the any material containing inert tiny pores to filter impurities. The porous filter 142 may be comprised of any material (e.g., stainless steel screen, ceramics, or glass) with apertures comprising about 30% of open area or total areas of openings as many holes on the plate. The port 144 could be connected to provide hydrogen for various applications. The shortwave UV lamps are located above the powder to provide non-thermal photo-stimulation. The disk or plate 146 may comprise any non-metal material (e.g., quartz or ceramic with apertures, stainless steel screen) with apertures comprising about 20-30% of open area or total areas of openings as many holes on the plate. The heating operation is implemented through the power supply adaptor 152 and internal heating unit 145, though the cartridge also may be heated by external electricity or microwave without the internal unit. The internal heating unit 145 (e.g., made of nichrome coils or microwave tube) is inserted to the cartridge to warm up the particles to a certain temperature, e.g., 75° C. for various applications. Before hydrogen-charged particles 147 are filled into the cartridge, the cartridge 140 is purged by argon gas. During desorption, the whole system first is vacuumed through the port 144 before hydrogen-charged particles are heated.

REFERENCES

All publications and patents mentioned herein, including those items listed below, are hereby incorporated by reference in their entirety as if each individual publication or patent was specifically and individually incorporated by reference. In case of conflict, the present application, including any definitions herein, will control.

1. H. Buchner, P. Pelloux-Gervais, M. Mullar, F. Grafwallner and P. Luger. Hydrogen and other alternative fuels for air and ground transportation. H. W. Pohl, Eds. (John Wiley & Sons, Chichester 1995). Chaps. 7-11.
2. J. Nitsch, W. Peschka, W. Schnurnberger, M. Fischer and H. Eichert. Hydrogen as an energy carrier. C. Winter and J. Nitsch, Eds. (Springer-Verlag. Berlin, 1988), Part B.
3. H. Imamura, N. Sakasai, T. Fujinaga, J Alloy Compd, 253, 34 (1997)
4. A. Zaluska, L. Zaluski, J. O. Strom-Olsen, Appli Phys A, 72, 157 (2001).
5. Dillon A., Heben M., Hydrogen Storage Using Carbon Adsorbents: Past, Present and Future, Applied Physics A, Vol. 72, pp. 133-142, 2001
6. Baker R., Hidalgo R., Park C., Rodriguez N., Tan C., Hydrogen Storage in Graphite Nanofibers, Proceedings of the 1998 U.S. DOE Hydrogen Program Review, USA 1998
7. Baker R., Chambers A., Park C., Rodriguez N., Terry R., Hydrogen Storage in Graphite Nanofibers, J. Physical Chemistry B, Vol. 102, No. 22, pp. 4253-4256, 1998
8. Johnson J., Wang Q., Computer Simulations of Hydrogen Adsorption on Graphite Nanofibers, J. Physical Chemistry B, Vol. 103, No. 2, pp. 277-281, 1999
9. Bose T., Chanine R., Poirier E., Hydrogen Adsorption in Carbon Nanostructures, Int. J. Hydrogen Energy, Vol. 26, pp. 831-835, 2001
10. Gupta B., Srivastava O., Further Studies on Microstructural Characterization and Hydrogenation behaviour of Graphitic Nanofibers, Int. J. Hydrogen Energy, Vol. 26, pp. 857-862, 2001
11. Chen F., Li W., Loutfy R., Murphy R., Wang J., Hydrogen Storage in Fullerenes and in an Organic Hydride, Proceedings of the 1998 U.S. DOE Hydrogen Program Review, USA 1998
12. Ahn C., Fultz B., Vajo J., Ye Y., Zinck J., hydrogen Adsorption and Phase Transition in Fullerite, Applied Physics Letters, Vol. 77, No., 14, pp. 2171-2173, 2000
13. Bose T., Chanine R., Low-pressure Adsorption Storage of Hydrogen, Int. J. Hydrogen Energy, Vol. 19, pp. 161-164, 1994
14. Bentley J., Fuller W., Hynek S., Hydrogen Storage by Carbon Sorption, Int. J. Hydrogen Energy, Vol. 22, No. 6, pp. 601-610, 1997
15. Stoffels, E., et, al, Plasma chemistry and surface processes of negatives, Plasma Sources and Technology, vol. 10 (2001) 311-317
16. Massey, H. S. W, Electronic and Ionic Impact Phenomena, vol II: Electron-Molecule Interations and Photo-Ionization, ed. H. S. W. Massey, et al (Oxford: Clarendon)
17. Christophorou, L. G., Electron-Molecule Interactions and their Applications (New York: Academic) 1984
18. Christophorou L G 1984 Electron-Molecule Interactions and their Applications (New York: Academic)
19. Spence, D., Lukke, K. R., Plasma modified Production of High-Current, High-Purity cw H+, D+, and H− Beams from Microwave-Driven Sources, Proc. Of LINAC '96. Paper MOP10(1996)

EQUIVALENTS

Those skilled in the art will recognize, or be able to ascertain using no more than routine experimentation, many equivalents to the specific embodiments of the invention described herein. While specific embodiments of the subject invention have been discussed, the above specification is illustrative and not restrictive. Many variations of the invention will become apparent to those skilled in the art upon review of this specification. The full scope of the invention should be determined by reference to the claims, along with their full scope of equivalents, and the specification, along with such variations. Such equivalents are intended to be encompassed by the following claims.

I claim:

1. A method, comprising:
   (a) contacting an ionizable gas with at least one porous particle, wherein the at least one porous particle comprises active sites;
   (b) supplying, to the ionizable gas while it is contacting the at least one porous particle, an electric field with a negative voltage sufficient to generate a non-equilibrium plasma comprising negative ions of the ionizable gas; and
   (c) adsorbing the negative ions onto the active sites of the at least one porous particle, which is a charcoal particle.

2. The method of claim 1, further comprising (d) desorbing the adsorbed negative ions from the active sites of the at least one porous particle by illuminating the at least one particle with ultraviolet light.

3. The method of claim 1, wherein the ionizable gas is hydrogen and the negative ions are negative hydrogen ions.

4. The method of claim 1, wherein the active sites may be at least one of the following: positive charges and dangling bonds.

5. The method of claim 1, wherein the active sites may be at least one of the following: positively charges and dangling bonds.

6. The method of claim 1, wherein the supplying and adsorbing are performed at ambient temperature.

7. The method of claim 1, wherein the at least one porous particle is present in a bed.

* * * * *